United States Patent [19]

Sakai

[11] Patent Number: 4,630,082

[45] Date of Patent: Dec. 16, 1986

[54] SEMICONDUCTOR DEVICE WITH MULTI-ELECTRODE CONSTRUCTION EQUIVALENT TO VARIABLE CAPACITANCE DIODE

[75] Inventor: Takamasa Sakai, Koriyama, Japan

[73] Assignee: Clarion Co., Ltd., Tokyo, Japan

[21] Appl. No.: 820,837

[22] Filed: Jan. 22, 1986

Related U.S. Application Data

[63] Continuation of Ser. No. 377,835, May 13, 1982, abandoned, which is a continuation of Ser. No. 129,750, Mar. 12, 1980, abandoned.

[30] Foreign Application Priority Data

Mar. 12, 1979 [JP] Japan .................................. 54-28539

[51] Int. Cl.[4] .............................................. H01L 29/92

[52] U.S. Cl. ........................................ 357/14; 357/15; 357/23.6; 357/51

[58] Field of Search ..................... 357/14, 15, 23, 6, 51

[56] References Cited

U.S. PATENT DOCUMENTS

| | | | |
|---|---|---|---|
| 3,411,053 | 11/1968 | Wiesner | 357/23 C |
| 3,893,147 | 7/1975 | Williams et al. | 357/51 |
| 4,017,885 | 4/1977 | Kendall et al. | 357/14 |
| 4,156,249 | 5/1979 | Koo | 357/51 |

FOREIGN PATENT DOCUMENTS

| | | |
|---|---|---|
| 954478 | 4/1964 | United Kingdom . |
| 1133634 | 11/1968 | United Kingdom . |
| 1283383 | 10/1970 | United Kingdom . |
| 1332045 | 10/1973 | United Kingdom . |

OTHER PUBLICATIONS

"New Multiple Tuning Diodes", by J. B. Dance; Radio & Electronics Constructor; Aug. 1975.

"A Hybrid Voltage-Variable Capacitor", by Bernard A. MacIver; IEEE Transactions on Electron Devices, vol. 18, No. 7, Jul. 1971.

"Varactor Diodes", by Gerald Schaffner; Electronics World; pp. 53-56; Jul. 1966.

"Thin-Oxide MOS Capacitance Studies of Fast Surface States"; Applied Physics Letters: 1 Sep. 1970; W. Hunter et al., vol. 17, No. 5; pp. 211-213.

"Lateral AC Current Flow Model for Metal-Insulator-Semiconductor Capacitors", by E. H. Nicollian and A. Goetzberger; IEEE Transactions on Electron Devices; Mar. 1965; pp. 108-117.

*Primary Examiner*—Joseph E. Clawson, Jr.

*Attorney, Agent, or Firm*—Oblon, Fisher, Spivak, McClelland, & Maier

[57] ABSTRACT

A semiconductor device with a multi-electrode construction equivalent to a conventional variable capacitance diode in function is disclosed. The semiconductor device is characterized in that a capacitance read-out portion with a capacitance read-out electrode and a plurality of depletion layer control portions with control electrodes, respectively, are formed in a bulk of a semiconductor single crystal, a depletion layer within said bulk is changed in width, when a plurality of said depletion layer control portions are reverse-biassed in turn through said control electrodes, whereby a change in capacitance can be read out through said capacitance read-out electrode.

1 Claim, 8 Drawing Figures

SEMICONDUCTOR DEVICE WITH MULTI-ELECTRODE CONSTRUCTION EQUIVALENT TO VARIABLE CAPACITANCE DIODE

This application is a continuation of application Ser. No. 377,835, filed May 13, 1982, abandoned, which is a continuation of application Ser. No. 129,750, filed Mar. 12, 1980, abandoned.

BACKGROUND OF THE INVENTION

This invention relates to a semiconductor device, and more particularly to a semiconductor device with a multielectrode construction equivalent to a variable capacitance diode, thereby being capable of extending a change in capacitance.

In general, a p-n junction diode is used as a variable capacitance diode because, when a reverse-bias is applied to the p-n junction, the carriers in the vicinity of the junction are moved to induce a depletion layer and the width of the resulting depletion layer is characteristic of depending upon the reverse-bias voltage.

The conventional variable capacitance diode has an essential construction such that an electrode applied with a bias voltage thereto functions as an electrode for reading out a change in capacitance therefrom in itself. Consequently, if a bulk having a uniformly distributed carrier concentration is provided, a C-V characteristic of the diode will represent a relatively gentle change in capacitance under a high reverse-bias condition and, therefore, it may be necessary to control a diffusion profile, for example by ion-implantation. This means that the production of devices may encounter a difficulty and, if possible, the control thereof may be limited within a narrow range. Also, for the sake of the construction as described above, it is an disadvantage that the degree of freedom is relatively small in a circuit design. Further, since the conventional variable capacitance diode is such that the depletion layer induced by the movement of carriers is limited in its width, a ratio of a maximum capacitance Cmax to a minimum capacitance Cmin is nothing mre than a relatively small value of about 20.

SUMMARY OF THE INVENTION

Accordingly, an object of the present invention is to overcome the above described disadvantages of the prior art and to provide a novel semiconductor device with a multielectrode construction, wherein an electrode applied with a reverse-bias thereto, that is, a control electrode for controlling the width of a depletion layer and a read-out electrode for reading out a change in capacitance are constructed separately and independently and a plurality of control electrodes are provided, thereby being capable of extending extremely the change in capacitance.

These and other objects and features of the present invention will be better understood from the following description taken in connection with the accompanying drawings.

DETAILED DESCRIPTION OF THE PREFERRED EMBODIMENTS

Figure 1:
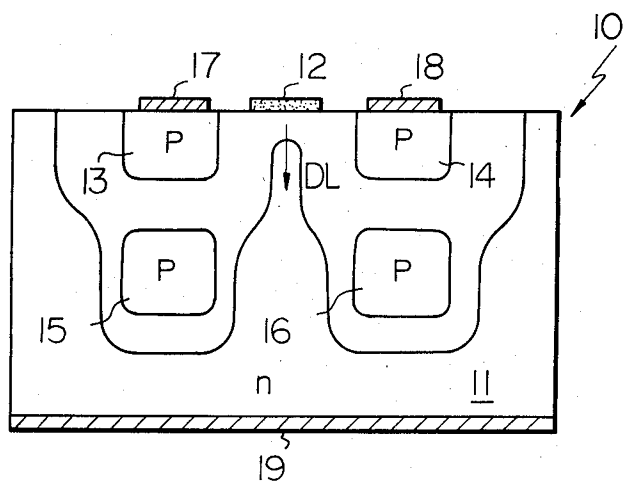
FIG. 1 shows a concrete construction of a vertical type semiconductor device with a multi-electrode construction of the present invention.

FIG. 1 shows a concrete construction of a vertical type semiconductor device 10 of the present invention, which is capable of extending a change in capacitance. A capacitance read-out portion 12 with a capacitance read-out electrode (not shown) of metal materials is formed on the upper surface of a semiconductor single crystal bulk 11 of, for example, n-type materials, and a plurality of p-type regions having control electrodes, respectively, of metal materials are formed apart from the capacitance read-out portion 12. In the illustrated embodiment, a first to fourth p-type regions 13, 14, 15 and 16 are provided. The control electrodes 17 associated with the first and second p-type regions 13, 15, and the electrode 18 associated with the third and fourth p-type regions 14, 16, are shown in FIG. 1. The above construction such that the p-type regions exist in both the upper and inner portions of the bulk may be produced by the steps of diffusing a p-type impurity into a semiconductor single crystal of n-type materials to form the third and fourth p-type regions 15 and 16, precipitation-growing the semiconductor single crystal by epitaxial growth, diffusing a p-type impurity into the semiconductor single crystal to form the first and second p-type regions 13 and 14, forcing p-type regions to reach the third and fourth p-type regions 15 and 16 by doping, and forming control electrodes associated with the p-type regions, respectively. The capacitance read-out portion 12 is formed of any one of, for example, a MOS construction, a MIS construction, a Schottky barrier and a p-type region for providing a p-n junction, which are formed on the bulk 11 of a semiconductor single crystal. An ohmic electrode (opposite electrode) 19 is formed on the lower surface of the bulk 11.

When the first to fourth p-n junction portions comprising the first to fourth p-type regions 13, 14, 15 and 16 and the semiconductor single crystal of n-type materials and reverse-biassed in turn through the control electrodes associated therewith, a depletion layer DL generated below the capacitance read-out portion 12 is changed in width in the vertical direction (arrowheaded direction), whereby the extended change in capacitance can be read out through the capacitance read-out electrode. The construction shown in FIG. 1, therefore, acts as a device equivalent to a variable capacitance diode.

Figure 2:
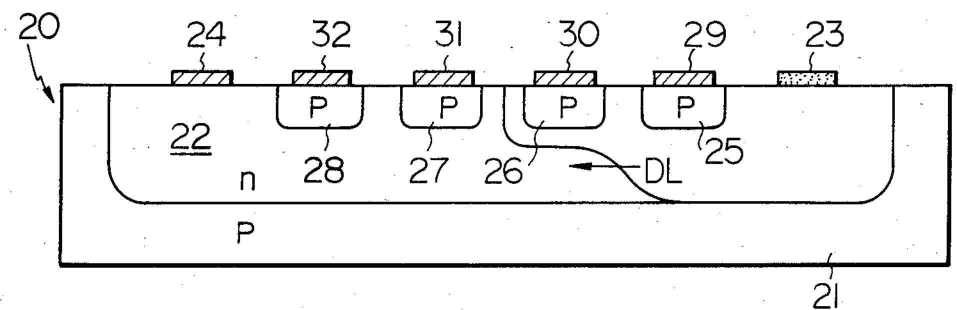
FIG. 2 shows a concrete construction of a horizontal type semiconductor device with a multi-electrode construction of the present invention.

FIG. 2 shows a concrete construction of a horizontal type semiconductor device 20 of the present invention, which is capable of extending a change in capacitance. For example, an n-type impurity is diffused into the upper portion of a bulk 21 of a semiconductor single crystal such as p-type materials to provide an n-type region 22, and a p-type impurity is diffused into the n-type region 22 to provide a plurality of p-type regions. Control electrodes of metal materials are formed on a plurality of the p-type regions, respectively. Also, provided on the n-type region 22 are a capacitance read-out portion 23 with a capacitance read-out electrode (not shown) of metal materials and an ohmic electrode 24 which functions as an opposite electrode. The illustrated embodiment is shown such that a first to fourth p-type regions 25, 26, 27 and 28 are formed as a plurality of the p-type regions and four control electrodes 29, 30, 31 and 32 are formed to be associated therewith. In the concrete, the capacitance read-out portion 23 is formed of any one of, for example, a MOS construction, a MIS construction, a Schottky barrier and a p-type region for providing a p-n junction, which are formed on the bulk 21 of the semiconductor single crystal. Alternatively, instead of a plurality of the p-type regions any one of the MOS construction, the MIS construction and the Schottky barrier may be selectively formed on the bulk 21 of the semiconductor single crystal, as a depletion layer control portion.

When the first to fourth p-n junction portions comprising the first to fourth p-type regions 25, 26, 27 and 28 and the n-type region 22, as shown in FIG. 2, are reverse-biassed in turn through the control electrodes associated therewith, a depletion layer DL generated below the capacitance read-out poriton 23 is changed in width in the horizontal direction (arrowheaded direction), whereby the extended change in capacitance can be read out through the capacitance read-out electrode. Therefore, the construction shown in FIG. 2 acts as a device equivalent to a variable capacitance diode.

In the case where the n-type and p-type regions in the explanation in relation to FIGS. 1 and 2 are reversed in arrangement, the same operation can be obviously accomplished.

Assuming that a differential capacitance of depletion layer control portions with control electrodes at a zero-bias is Co and a differential capacitance at the growth of a depletion layer is $C_D$, a differential capacitance C read-out through the capacitance read-our portion is equivalently as follows:

$$1/C=1/C_o+1/C_D \quad (1)$$

Also, assuming that the width of a depletion layer is d, the area of an electrode is S and the dielectric constant of a semiconductor single crystal is $\epsilon_s$, a differential capacitance of depletion layer $C_D$ is as follows:

$$C_D=\epsilon_s S/d \quad (2)$$

In order to enlarge the ratio of change in capacitance, as understood by the formula (1), it is necessary to reduce sufficiently the capacitance $C_D$ against Chd o, that is, as represented in the formula (2), to increase the width of depletion layer d.

Consquently, a conventional variable capacitance diode with a single electrode construction, wherein a bias electrode functions as a capacitance read-out electrode in itself, is considerable limited in the width d of a grown depletion layer caused by the construction thereof. However, according to the semiconductor device with a multi-electrode construction of the present invention, the width of depletion layer d can be grown much larger than in the prior art by means of forming a plurality of depletion layer control portions and changing merely and adequately the shape of depletion layer control portions and, therefore, a change in capcitance, which is read out, can be expected to increase rapidly.

And now, the semiconductor device of the present invention, wherein a bias electrode for controlling the width of a depletion layer is completely separated from a capacitance read-out electrode, will present many advantages as described below, if such device is applied to any concrete circuit devices.

Figure 3:
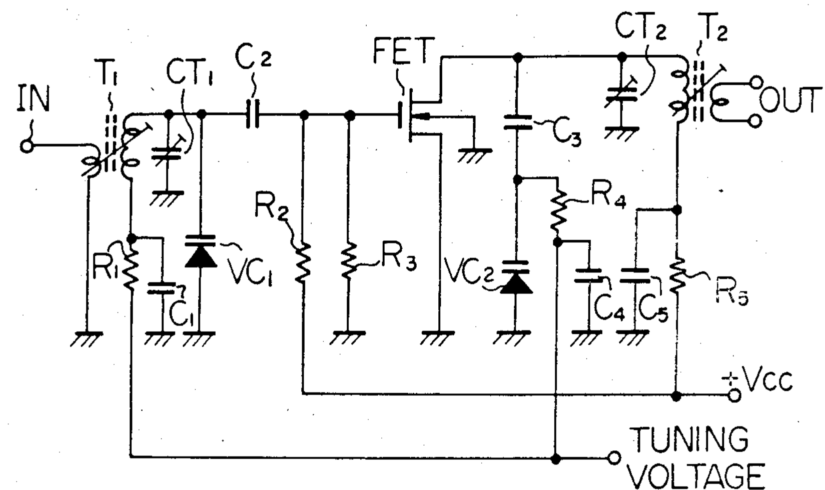
FIG. 3 shows a tuning circuit of a conventional RF amplifier, wherein a conventional variable capacitance diode with a single electrode construction is used.

FIG. 3 shows a tuning circuit of a conventional RF amplifier, wherein Field Effect Transistor FET is used and conventional two-terminal type variable capacitance diodes $VC_1$ and $VC_2$ are used for a stage coupling circuit and a local oscillating circuit, respectively. On the other hand, FIG. 4 shows a tuning circuit of an RF amplifier, wherein the variable capacitance diodes as shown in FIG. 3 are replaced by the semiconductor device $VC_1'$ and $VC_2'$, respectively, of the present invention, each of which has a multi-electrode construction.

Figure 4:
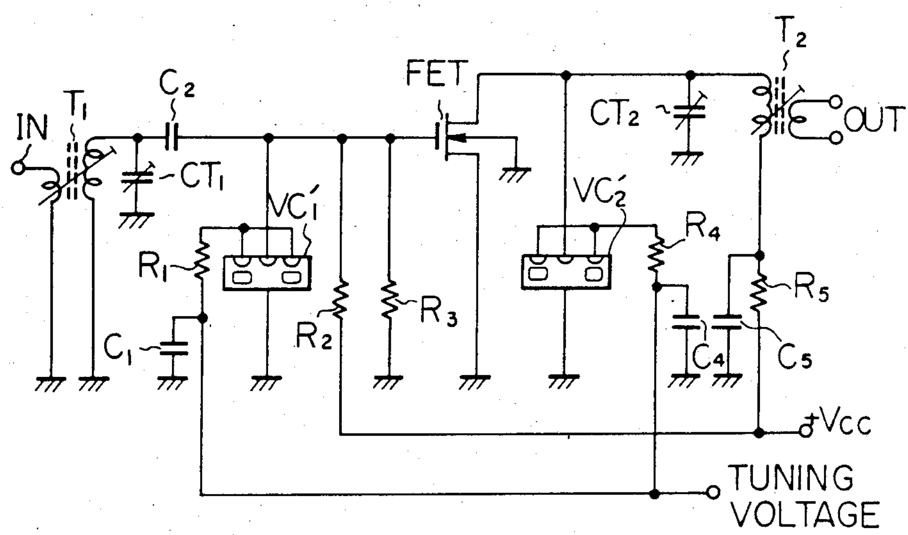
FIG. 4 shows a tuning circuit of an RF amplifier, wherein the semiconductor device of the present invention is used.
Figure 5:
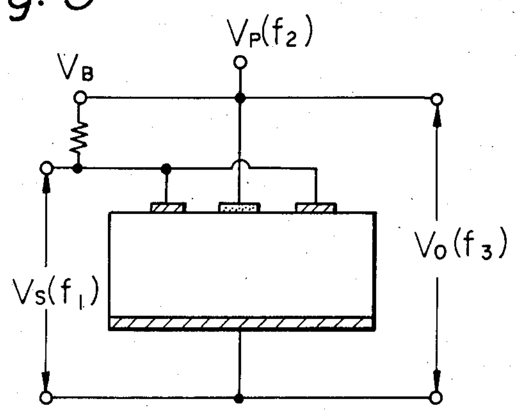
FIGS. 5 through 8 show parametric mixer circuits using the vertical type semiconductor device as shown in FIG. 1.
Figure 6:
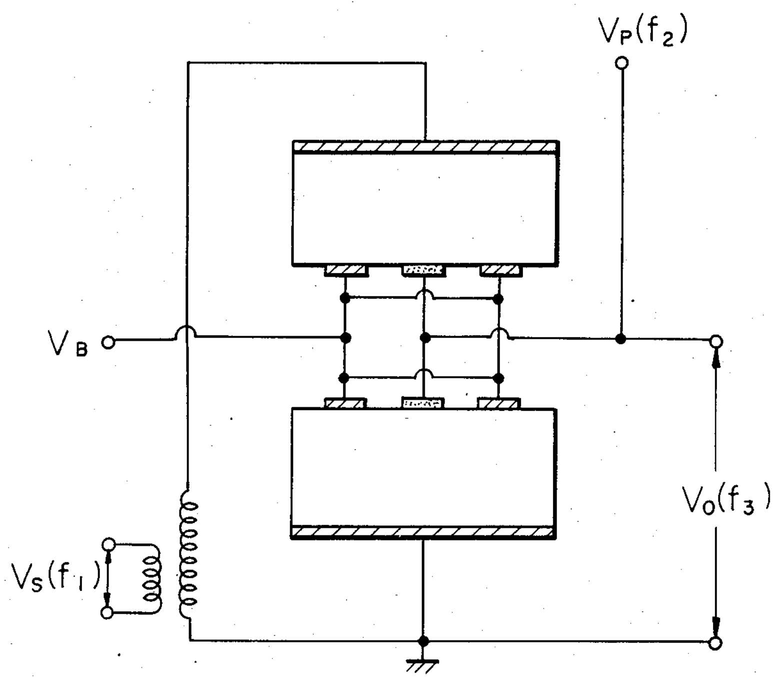
Figure 7:
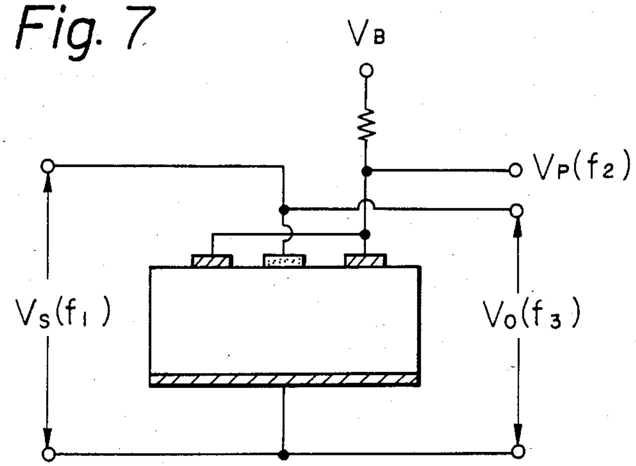
Figure 8:
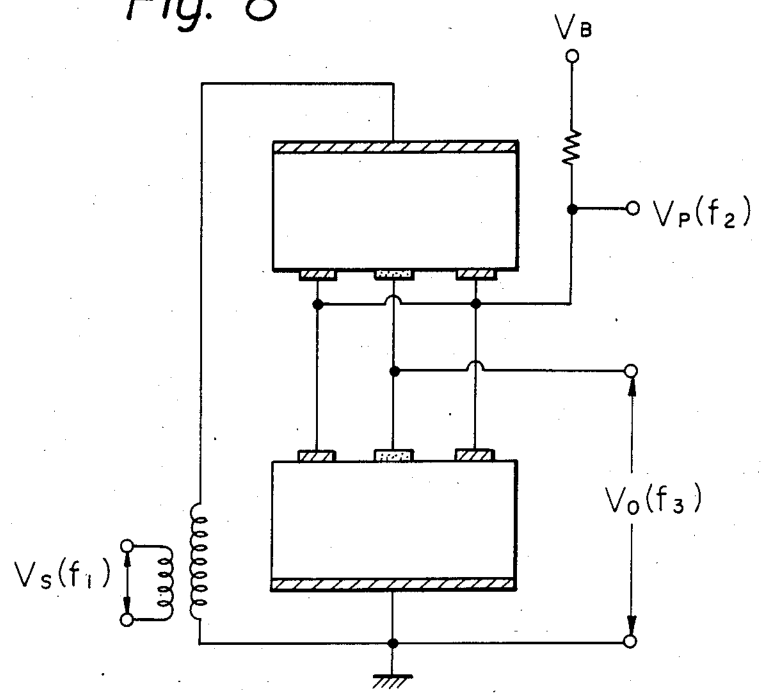

As understood by comparing FIG. 3 with FIG. 4, although the circuit as shown in FIG. 3 has a capacitor $C_2$ which functions as a DC voltage blocking capacitor for the variable capacitance diode $VC_1$ and a coupling capacitor, and a capacitor $C_3$ which functions as a DC voltage blocking capacitor for the variable capacitance diode $VC_2$, the circuit as shown in FIG. 4 is such that the DC voltage blocking capacitors fall into disuse and the capacitor $C_2$ which functions as a coupling capacitor is merely moved and inserted into the side of a transformer $T_1$, since the control electrode each of the semiconductor devices $VC_1$, and $VC_2$, is separated from the capacitance read-out electrode associated therewith. This difference between FIGS. 3 and 4 in circuit construction has an important meaning in the case of integrating circuits. That is, when the variable capacitance diodes were formed within a integrated circuit, the capacitors $C_2$ and $C_3$ had to be provided as external parts because it was difficult to inform these capacitors within the integrated circuit in the prior art, and, therefore, this caused the pins of an integrated circuit element to increase in number. However, according to the present invention, the capacitor has no connection with the integration of the variable capacitance diodes and the capacitor $C_3$ falls into disuse, whereby the pins of the integrated circuit element can be reduced in number. Additionally, in the circuit as shown in FIG. 4, a change in capacitance which may be caused by any voltage of a capacitance read-out electrode for reading out the change in capacitance of the semiconductor device can be minimized. Thus, a high frequency voltage scarcely changes any capacitance value of the semiconductor device, whereby the generation of distortion can be minimized.

Further, according to the semiconductor devices shown in FIGS. 1 and 2, it may be possible to assemble a super wide-band electronic tuning circuit in the form of a single device.

FIGS. 5 through 8 show parametric mixer circuits, respectively, each of which uses one or two semiconductor devices with multi-electrode constructions, respectively, of the present invention. In the respective circuit as shown, $V_s$ represents an input signal voltage, $V_p$ represents an exciting (pumping) voltage (local oscillating signal voltage), $V_o$ represents an output signal voltage and $V_B$ represents a bias voltage. And, assuming that a receiving frequency is $f_1$, a local oscillating frequency is $f_2$ and an intermidiate frequency (10.7 MHz) is $f_3$, a mixing can be accomplished in the relation of $f_2=f_1+f_3$ or $f_2=f_1-f_3$, provided that the local oscillating frequency $f_2$ is obtained from the upper side of the receiving frequency $f_1$ or is obtained from the lower side thereof. If, in particular, there is a relation, $f_2=2f_1$, between the receiving frequency $f_1$ and the local oscillating frequency $f_2$, the parametric mixers shown in FIGS. 5 to 8 function as parametric amplifiers, respectively.

In the parametric system using a conventional variable capacitance diode with a single electrode construction, there were some problems in, for example, the range of the change in capacitance and the degree of freedom in a circuit design, because both a pump voltage and a signal voltage are input through a single electrode. On the other hand, according to the parametric system using a semiconductor device with a multi-electrode construction of the present invention, a rapid change in capacitance and an extremely extended degree of freedom in a circuit design can be obtained. Additionally, according to a parametric mixer using the present invention, although the mixer has a relatively large loss, the value of S/N equal to that of the mixer using Schottky barrier diode which may be appreciated as the most popular device in the present time can be obtained. This teaches that the loss in the mixer using a Schottky barrier diode is caused by an inside resistance, and, therefore, is converted to a heat energy, while the loss in the parametric mixer using the present invention means that the energy of a pump signal is transferred to an output signal.

What is claimed is:

1. A semiconductor device with a multielectrode construction and having a variable capacitance, said device comprising:

a semiconductor single crystal bulk having a first conductivity;

a first group of depletion control regions aligned along and formed in one surface of said bulk, each of said first group of control regions having a second conductivity opposite to said first conductivity, and respectively forming a first group of p-n junction regions in said bulk;

an ohmic electrode formed on another surface of said bulk, opposite to said one surface of said bulk;

a depletion layer within said bulk;

a second group of depletion control regions aligned in the thickness direction of the bulk from said one surface, each of said second group of depletion control regions having said second conductivity and respectively forming a second group of small p-n junction regions in said bulk;

a plurality of control electrodes formed on said one surface of said bulk, each of said control electrodes being operatively coupled to said first and second groups of the depletion control regions which are aligned in the thickness direction of said bulk wherein each of said electrodes receive a voltage signal from external bias means;

a capacitance read-out electrode formed on said one surface of the bulk and positioned at a substantially intermediate point among said plurality of control electrodes;

a capacitance read-out region formed in a portion of said bulk immediately beneath said capacitance read-out electrodes; and a plurality of depletion layers each of said depletion layers spreading from the environs of each of said first and second groups of depletion control regions wherein said depletion layers spread throughout said bulk when said voltage signal from said external bias means is applied between said control electrodes and said ohmic electrodes so that said depletion control regions are each reversed-bias whereby said depletion layers overlap and whereby a wide change of said depletion layers in the thickness direction of said bulk, which is caused by said overlapped depletion layers, is detected in said capacitance read-out region and is read-out through said capacitance read-out electrode as a change in capacitance of said device.

* * * * *